US012690311B2

(12) United States Patent
Peana et al.

(10) Patent No.: US 12,690,311 B2
(45) Date of Patent: Jul. 21, 2026

(54) META-OPTICS DISPLAY STRUCTURE FOR USE WITH INFORMATION HANDLING SYSTEMS

(71) Applicant: Dell Products L.P., Round Rock, TX (US)

(72) Inventors: Stefan Peana, Austin, TX (US); Steven E. Davis, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 509 days.

(21) Appl. No.: 18/216,691

(22) Filed: Jun. 30, 2023

(65) Prior Publication Data

US 2025/0006874 A1    Jan. 2, 2025

(51) Int. Cl.
H10H 20/855      (2025.01)
H10W 90/00       (2026.01)

(52) U.S. Cl.
CPC .......... H10H 20/855 (2025.01); H10W 90/00 (2026.01)

(58) Field of Classification Search
CPC ........................... H10H 20/855; H01L 25/167

USPC ................................................ 257/88–89, 97
See application file for complete search history.

(56) References Cited

U.S. PATENT DOCUMENTS

| | | | |
|---|---|---|---|
| 2020/0020825 A1* | 1/2020 | Yang ..................... | H10H 20/825 |
| 2022/0100227 A1* | 3/2022 | Schwager ............. | G06F 1/1658 |
| 2023/0243696 A1* | 8/2023 | Lucente .................... | G01J 1/44 |
| | | | 250/208.2 |
| 2024/0260366 A1* | 8/2024 | Chao ..................... | H10K 59/13 |

* cited by examiner

*Primary Examiner* — Eliseo Ramos Feliciano
*Assistant Examiner* — Mikka Liu
(74) *Attorney, Agent, or Firm* — Terrile, Cannatti & Chambers, LLP; Stephen A. Terrile

(57)         ABSTRACT

A meta-optics display device for use with an information handling system. The meta-optics display device includes a plurality of micro-LED pillars, and, a plurality of micro-sensors, at least some of the plurality of micro-sensors being associated with respective micro-LED pillars of the plurality of micro-LED pillars, the plurality of micro-sensors comprising a first set of micro-sensors and a second set of micro-sensors, the first set of micro-sensors being tuned for a first focal distance, the second set of micro-sensors being tuned for a second focal distance.

15 Claims, 11 Drawing Sheets

900

910

920

META-OPTICS DISPLAY STRUCTURE FOR USE WITH INFORMATION HANDLING SYSTEMS

BACKGROUND OF THE INVENTION

Field of the Invention

The present invention relates to information handling systems. More specifically, embodiments of the invention relate to a meta-optic display structure for use with an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

In one embodiment the invention relates to a meta-optics display device, comprising: a plurality of micro-LED pillars, and, a plurality of micro-sensors, at least some of the plurality of micro-sensors being associated with respective micro-LED pillars of the plurality of micro-LED pillars, the plurality of micro-sensors comprising a first set of micro-sensors and a second set of micro-sensors, the first set of micro-sensors being tuned for a first focal distance, the second set of micro-sensors being tuned for a second focal distance.

In another embodiment the invention relates to a lid housing portion of an information handling system, comprising: a display cover portion; a rear display cover portion coupled to the top cover portion; and, a meta-optics display device mounted to the display cover portion, the meta-optics display device comprising: a plurality of micro-LED pillars, and, a plurality of micro-sensors, at least some of the plurality of micro-sensors being associated with respective micro-LED pillars of the plurality of micro-LED pillars, the plurality of micro-sensors comprising a first set of micro-sensors and a second set of micro-sensors, the first set of micro-sensors being tuned for a first focal distance, the second set of micro-sensors being tuned for a second focal distance.

In another embodiment the invention relates to an information handling system comprising: a processor; a data bus coupled to the processor; an information handling system chassis housing, the housing comprising a base chassis; and, an information handling system display chassis, the information handing system display chassis comprising a meta-optics display device, the meta-optics display device comprising: a plurality of micro-LED pillars, and, a plurality of micro-sensors, at least some of the plurality of micro-sensors being associated with respective micro-LED pillars of the plurality of micro-LED pillars, the plurality of micro-sensors comprising a first set of micro-sensors and a second set of micro-sensors, the first set of micro-sensors being tuned for a first focal distance, the second set of micro-sensors being tuned for a second focal distance.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
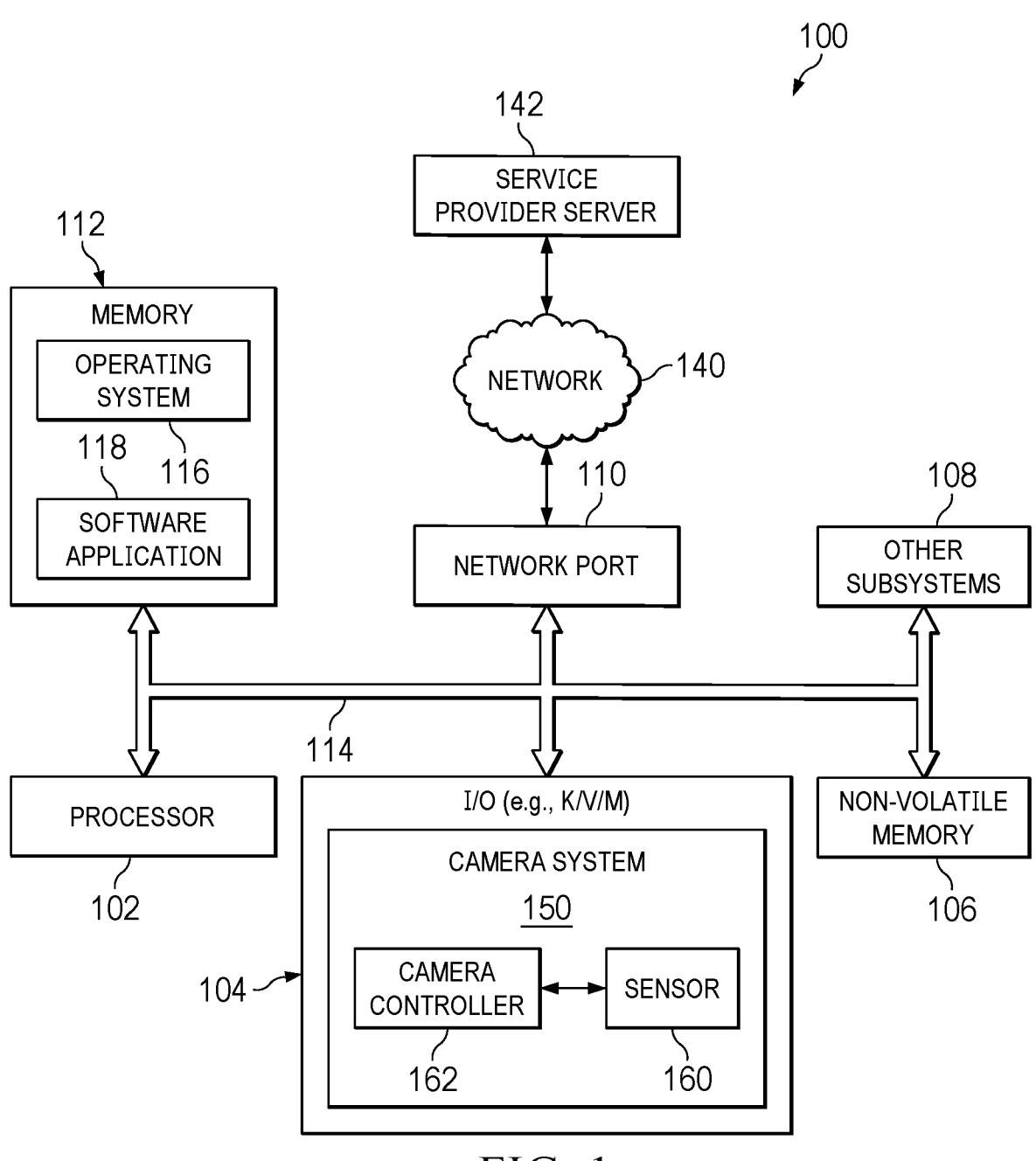
FIG. 1 shows a general illustration of components of an information handling system as implemented in the system and method of the present invention.

Various aspects of the present disclosure include an appreciation that with portable type information handling system, form factor limitations in the Z dimension are often driven by the display and camera thicknesses. Various aspects of the present disclosure include an appreciation that with portable type information handling system, displays are shifting to plastic organic light emitting diode (OLED) type displays which can allow driving display thicknesses below 2 mm.

Various aspects of the present disclosure include an appreciation that emerging micro-optics display technology make use of micro-LED technology components. Various aspects of the present disclosure include an appreciation that emerging micro-optics display technology will likely displace incumbent liquid crystal display (LCD) and OLED display technologies. Various aspects of the present disclosure include an appreciation that micro-LED technology can provide superior display performances with a lower total cost when compared with known LCD and OLED display technologies. Various aspects of the present disclosure include an appreciation that transitioning to micro-LED display technology will likely result in replacing the large and expensive factories required to produce LCD and OLED displays with a horizontal supply chain of smaller entities likely requiring minimum capital investment. Various aspects of the present disclosure include an appreciation that to do so it is desirable to develop new materials, assembly equipment and processes relating to micro-LED displays.

Various aspects of the present disclosure include an appreciation that it would be desirable to provide a micro-LED controller which is configured to control the output from the micro-LED light sources by capturing the light output, color mixing the light output, and then directing the light output outward into a flat pattern to provide a flat image at the surface of the display. Various aspects of the present disclosure include an appreciation that known solutions for managing light are often based on refractive/diffractive optical technology which can make the optical control layer bulky and difficult to manage.

Accordingly, in certain embodiments a meta-optics display architecture is disclosed. In various embodiments, the meta-optics display architecture comprises a micro-LED display controller. In certain embodiments, the micro-LED display controller is contained within a semiconductor chip such as a complementary metal oxide semiconductor (CMOS) type semiconductor ship. In certain embodiments, the micro-LED display controller provides a pixel driving function which is not possible with known thin film transistor (TFT) driving. In certain embodiments, the meta-optics display architecture can be configured with additional functionality such as a camera within the display or light sensors within the display receive light input along a side of a pixel that already has upward light output.

In certain embodiments, the meta-optics display architecture uses a nanoimprint technology for light management. In certain embodiments, the nanoimprint technology is deposited onto a transparent substrate, such as glass, to provide flat meta-optic lenses. In certain embodiments, the nanoimprint features are designed to couple with light input/output, then to direct the light to a desirable pattern. In various embodiments, nanoimprint features are applied to both surfaces of the glass substrate or can be stacked in multi-layers for complex light management. In certain embodiments, a meta-optic lens rests on top of a mask structure designed to create cavity walls to prevent light cross talk between pixels. In certain embodiments, the mask structure includes a mask grid designed to create cavity walls to prevent light cross talk between pixels. In certain embodiments, the mask structure assists with inkjet deposition of a quantum dot (QD) color conversion material or color filters.

Such a meta-optic display architecture greatly simplifies the display optical design, enhances light output due to a square form factor and simplifies display assembly. In certain embodiments, the meta optic display architecture includes a micro-lens. In certain embodiments, the micro-lens is imprinted with pillars features designed to capture, mix and distribute monochrome light (R, G, or B) to a surface of the display. In certain embodiments, the monochrome light includes a red light portion, a green light portion, a blue light portion, or a combination thereof. In certain embodiments, the imprint features are imprinted to a single surface, to a pair of surfaces, or to multiple surface layers. In certain embodiments, the micro-lens with imprinted features allows outside light, visible or IR, specific visible or non-visible optical communication wavelength light, to pass through the glass and through the internal imprinted pillars layer to spread light across the sensor (e.g., a camera sensor, a light sensor, an IR sensor, etc.).

Various aspects of the present disclosure include an appreciation that known micro-LED display technology makes use of a micro-lens feature which includes a plurality of omni directional light control, bulbous micro-lens features for each sub pixel of the micro-LED display. Various aspects of the present disclosure include an appreciation that it would be desirable to provide an optical technology capable of bi-directional light control and regional optical adjustment to facilitate optimum light management.

Accordingly, in certain embodiments, the meta-optic display structure includes a bi-directional micro-lens. In certain embodiments, the micro-lens rests on top of the mask structure or an interposer layer. In certain embodiments, the micro-lens is locked in place to provide structural integrity to the display architecture. In certain embodiments, the micro-lens is locked in place using UV or other processes. In certain embodiments, the micro-lens provides a top layer passivation function. In certain embodiments, the micro-lens is configured as a laminated film. In certain embodiments, the micro-lens is configured as a laminated polarizer. In certain embodiments, the micro-lens provides protection from touch and light pen writing and optimizes front of screen (FOS) display performance.

In certain embodiments, the micro-LED display controller provides time multiplexing pixel control. In certain embodiments, the time multiplexing pixel control provided by the micro-LED display controller allows light trafficking in and out of respective pixels and/or adjacent pixels without light cross talk or color aberration. In certain embodiments, the meta-optic display architecture comprises a micro-LED pixel array. In certain embodiments, the micro-LED pixel array includes a plurality of light emitting sub-pixels. In certain embodiments, certain sub-pixels include additional functionality. In certain embodiments, the additional functionality includes one or more of a camera sensor function, a light senor function, an IR sensor function, etc. In certain embodiments, the additional functionality is distributed across the display surface in repeating pattern. In certain embodiments, the repeating pattern includes a light sensor pattern (e.g. R, G, B, light sensor), a next to pattern (e.g., (R, G, B, Red camera sensor), (R, G, B, Green camera sensor), (R, G, B, Blue camera sensor), (R, G, B, R IR sensor)), etc. Such a meta-optic display architecture simplifies light management, eliminates bulky refractive micro lenses, and simplifies display assembly structure.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, a touchpad or touchscreen, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise at least one software application 118. In one embodiment, the information handling system 100 is able to download the software application from the service provider server 142. In another embodiment, the software application 118 is provided as a service from the service provider server 142. In certain embodiments, the information handling system 100 includes a camera system 150. In certain embodiments, the camera system 150 includes a camera sensor 160, a camera controller 162, or a combination thereof. In certain embodiments, the camera system 150 includes a discrete camera system, a camera system integrated within a display device, or a combination thereof.

In certain embodiments, the display includes a meta-optics display architecture. In various embodiments, the meta-optics display architecture comprises a micro-LED display controller. In certain embodiments, the micro-LED display controller is contained within a semiconductor chip such as a complementary metal oxide semiconductor (CMOS) type semiconductor ship. In certain embodiments, the micro-LED display controller provides a pixel driving function. In certain embodiments, the meta-optics display architecture is configured with additional functionality such as camera functionality within the display or light sensors within the display to receive light input along a side of a pixel that already has upward light output.

In certain embodiments, the meta-optics display architecture uses a nanoimprint technology for light management. In certain embodiments, the nanoimprint technology is deposited onto a transparent substrate, such as glass, to provide flat meta-optic lenses. In certain embodiments, the nanoimprint features are designed to couple with light input/output then to direct the light to a desirable pattern. In various embodiments, nanoimprint features are applied to both surfaces of the glass substrate or can be stacked in multi-layers for complex light management. In certain embodiments, a meta-optic lens rests on top of a mask structure designed to create cavity walls to prevent light cross talk between pixels. In certain embodiments, the mask structure includes a mask grid designed to create cavity walls to prevent light cross talk between pixels. In certain embodiments, the mask structure assists with inkjet deposition of a quantum dot (QD) color conversion material or color filters. Such a meta-optic display architecture greatly simplifies the display optical design, enhances light output due to a square form factor and simplifies display assembly. In certain embodiments, the meta-optic display architecture includes a micro-lens.

In certain embodiments, the micro-lens is imprinted with pillar features designed to capture, mix and distribute monochrome light (R, G, or B) to a surface of the display. In certain embodiments, the monochrome light includes a red light portion, a green light portion, a blue light portion, or a combination thereof. In certain embodiments, the imprint features are imprinted to a single surface, to a pair of surfaces or to multiple surface layers. In certain embodiments, the micro-lens with imprinted features allows outside light, visible or IR, specific visible or non-visible optical communication wavelength light, to pass through the glass and through the internal imprinted pillars layer to spread light across the sensor (e.g., a camera sensor, a light sensor, an IR sensor, etc.).

In certain embodiments, the meta-optic display structure includes a bi-directional micro-lens. In certain embodiments, the micro-lens rests on top of the mask structure or an interposer layer. In certain embodiments, the micro-lens is locked in place to provide structural integrity to the display architecture. In certain embodiments, the micro-lens is locked in place using UV or other processes. In certain embodiments, the micro-lens provides a top layer passivation function. In certain embodiments, the micro-lens is configured as a laminated film. In certain embodiments, the micro-lens is configured as a laminated polarizer. In certain embodiments, the micro-lens provides protection from touch and light pen writing and optimizes front of screen (FOS) display performance.

In certain embodiments, the micro-LED display controller provides time multiplexing pixel control. In certain embodiments, the time multiplexing pixel control provided by the micro-LED display controller allows light trafficking in and out of respective pixels and/or adjacent pixels without light cross talk or color aberration. In certain embodiments, the meta-optic display architecture comprises a micro-LED pixel array. In certain embodiments, the micro-LED pixel array includes a plurality of light emitting sub-pixels. In certain embodiments, certain sub-pixels include additional functionality. In certain embodiments, the additional functionality includes one or more of a camera sensor function, a light senor function, an IR sensor function, etc. In certain embodiments, the additional functionality is distributed across the display surface in repeating pattern. In certain embodiments, the repeating pattern includes a light sensor pattern (e.g. R, G, B, light sensor), a next to pattern (e.g., (R, G, B, Red camera sensor), (R, G, B, Green camera sensor), (R, G, B, Blue camera sensor), (R, G, B, R IR sensor)), etc. Such a meta-optic display architecture simplifies light management, eliminates bulky refractive micro lenses, and simplifies display assembly structure.

In certain embodiments the camera system 150 comprises a meta-optics camera system. In certain embodiments, the meta-optics camera system includes the camera sensor 160, the camera controller 162, or a combination thereof. In certain embodiments, the camera sensor 160 includes a meta-optic lens. In certain embodiments, the meta-optic lens includes a patterned dielectric. In certain embodiments, the patterned dielectric is configured for phase delay. In certain embodiments, the phase delay is dependent on the composition and pattern of the dielectric pattern (e.g., the height (H) of the pattern, the width (W) of the pattern, material, or a combination thereof). In certain embodiments, the camera controller 162 performs a reconstruction operation on the information gathered by the meta-optics lens. In certain embodiments, the meta-optics lens includes a plurality of pixel lens portions. In certain embodiments, each pixel lens portion may include a plurality of lens elements. In certain embodiments, each pixel lens portion includes four to six lens elements. In certain embodiments, the lens elements provide a refractive function.

Figure 2:
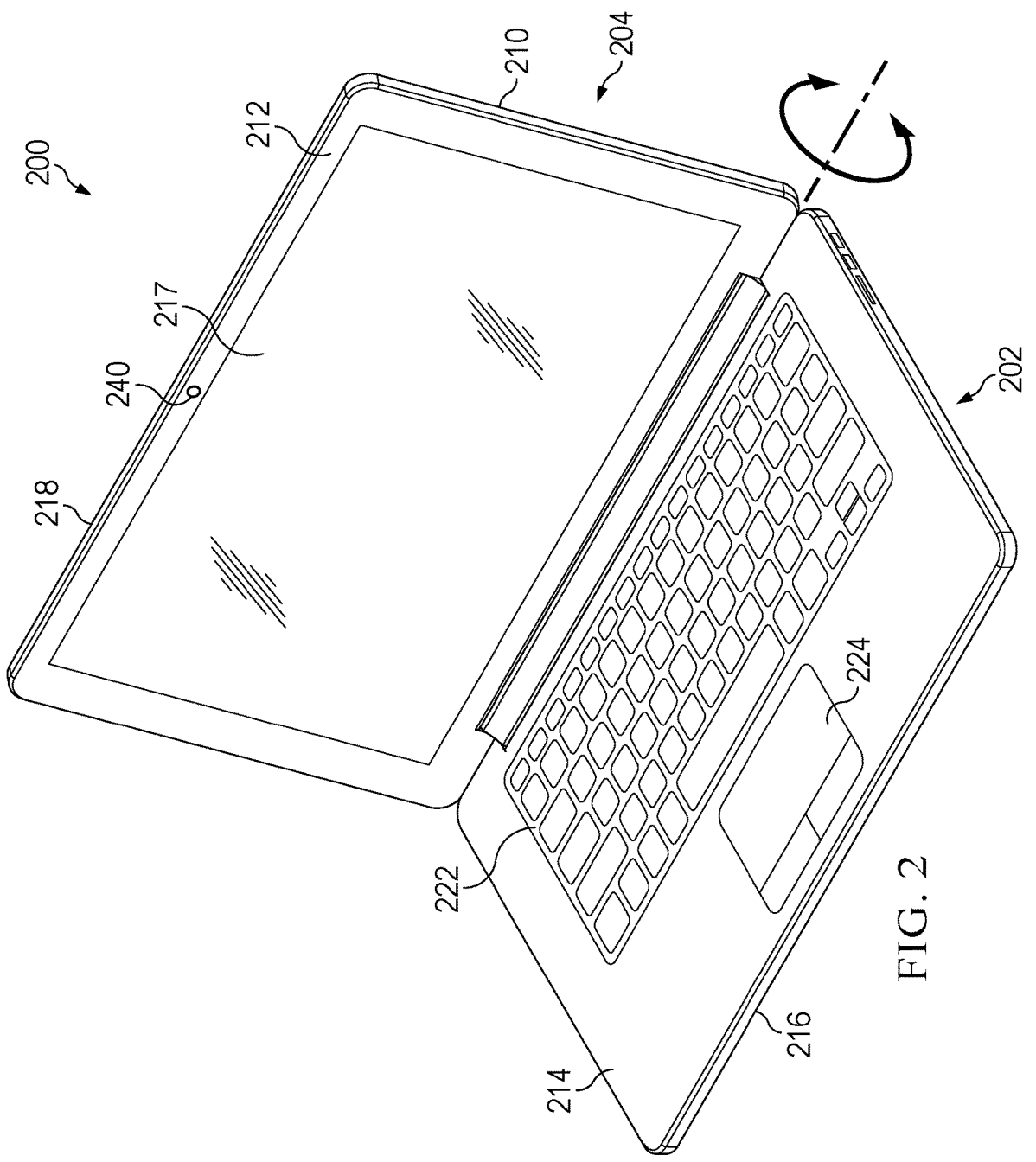
FIG. 2 shows a perspective view of an example portable information handling system.

FIG. 2 shows a perspective view of an example portable information handling system chassis 200 such as a tablet type portable information handling system, a laptop type portable information handling system, or any other mobile information handling system. It will be appreciated that some or all of the components of the information handling system 100 may be included within information handling system chassis 200. The portable information handling system 200 chassis includes a base chassis 202 and a display chassis 204 shown in an open configuration. It will be appreciated that a closed configuration would have the display chassis 204 fully closed onto the base chassis 202.

The base chassis 202 or the display chassis 204 of the information handling system 200 may comprise an outer metal case or shell. The information handling system 200 may include a plurality of chassis portions. In various embodiments, the information handling system 200 may include some or all of an A-Cover 210, a B-Cover 212, a C-cover 214 and a D-Cover 216. In various embodiments, the A-Cover 210 and the B-Cover 212 provide the display chassis 204. In various embodiments, the C-Cover 214 and the D-Cover 216 provide the base chassis 202.

In various embodiments, the A-cover 210 encloses a portion of the display chassis 204 of the information handling system 200. In various embodiments, the B-cover 212 encloses another portion of the display chassis 204 of the information handling system 200. In various embodiments, the B-Cover may include a display screen 217 and a bezel 218 around the display screen.

In various embodiments, the C-cover 214 encloses a portion of the base chassis 202 of the information handling system 200. In various embodiments, the C-cover 214 may include, for example, a keyboard 222, a trackpad 224, or other input/output (I/O) device. In various embodiments, certain components of the information handling system such as a mother board are mounted within the C-Cover 214. In various embodiments, the D-cover 216 encloses another portion of the base chassis 202 of the information handling system 200.

When placed in the closed configuration, the A-cover 210 forms a top outer protective shell, or a portion of a lid, for the information handling system 200, while the D-cover 216 forms a bottom outer protective shell, or a portion of a base, for the information handling system. When in the fully closed configuration, the A-cover 210 and the D-cover 216 would be substantially parallel to one another.

In some embodiments, both the A-cover 210 and the D-cover 216 may be comprised entirely of metal. In some embodiments, the A-cover 210 and D-cover 216 may include both metallic and plastic components. For example, plastic components that are radio-frequency (RF) transparent may be used to form a portion of the C-cover 214.

In various embodiments, the display chassis 204 may be movably connected to a back edge of the base chassis 202 via one or more hinges. In this configuration, the hinges allow the display chassis 204 to rotate from and to the base chassis 202 allowing for multiple orientations of the information handling system 200. In various embodiments, the information handling system may include a sensor to detect the orientation of the information handling system and activate or deactivate any number of antenna systems based on the occurrence of any specific orientation. In some embodiments, the information handling system may be a laptop with limited rotation of the display chassis 204 with regard to the base chassis 202, for example up to 180° rotation arc. In other embodiments the information handling system 200 may be a convertible information handling system with full rotation to a tablet configuration.

In various embodiments, the display chassis 204 defines an aperture 240 through which a camera system such as camera system 150 can receive image data. In certain embodiments, the aperture 240 corresponds to a baffle portion of a camera system.

Figure 3:
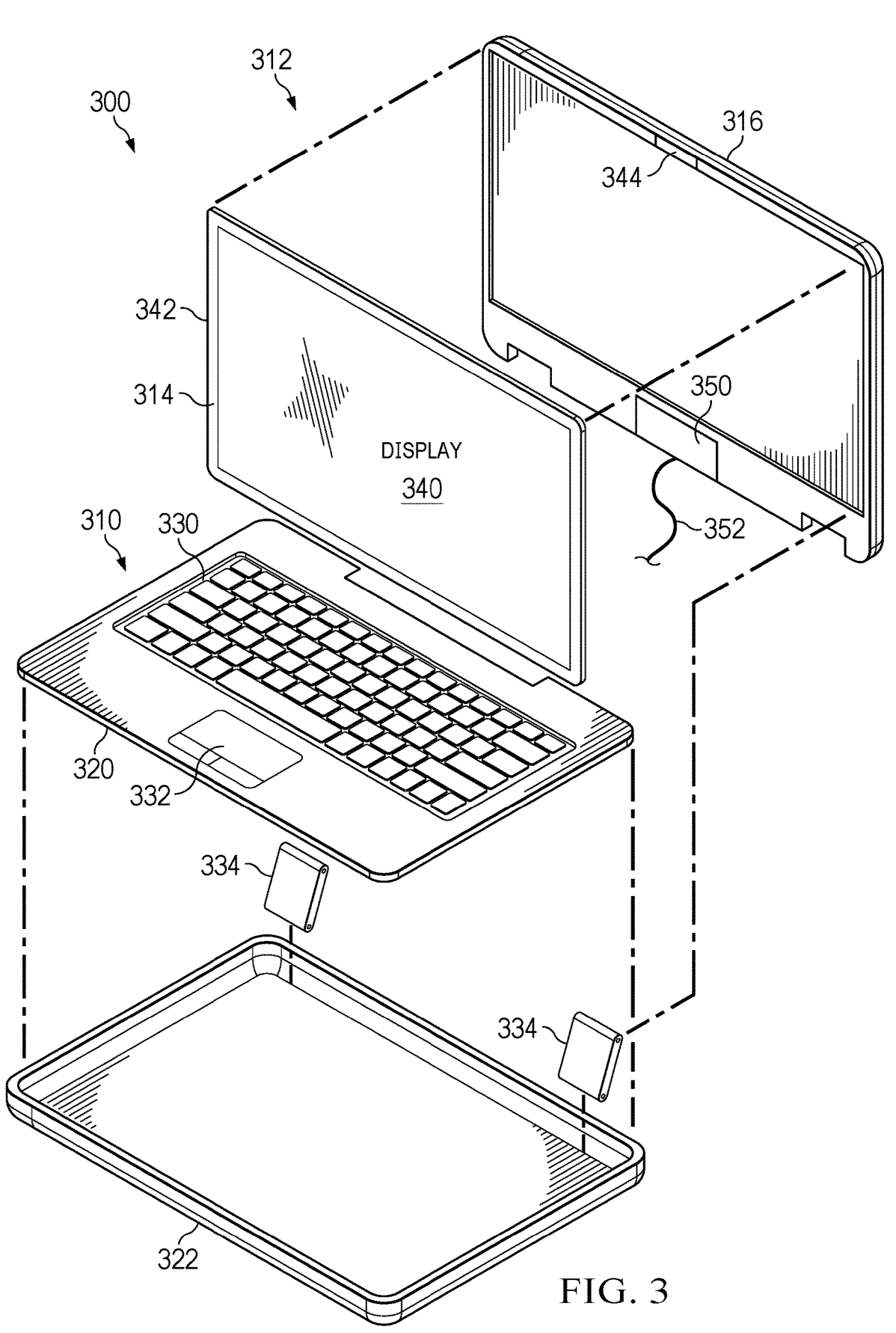
FIG. 3 shows a blown-up view of a portable information handling system.

FIG. 3 shows a blown-up view of a portable information handling system 300 having rotationally-coupled housing portions. In the example embodiment, a main housing portion 310 (which corresponds to a base chassis 202) rotationally couples to a lid housing portion 312 (which corresponds to a display chassis 204) to support various configurations to interact with an end user. Main housing portion 310 may hold one or more components of the portable information handling system, including but not limited to processor 102, system bus 114, memory subsystem 112, I/O subsystem 104 and network interface 110 discussed with respect to FIG. 1. Main housing portion 310 includes a top cover portion 320 (which includes the C-Cover 214) and a bottom cover portion 322 (which includes the D-Cover 216). Lid housing portion 312 includes a display cover portion 314 (which includes the B-Cover 212) and a rear display cover portion 316 (which includes the A-Cover 210). The top cover portion 320 may include an integrated keyboard 330 or other I/O devices, such as a trackpad 332 or microphone (not shown). In various embodiments, the keyboard 330 may be mounted to the top of the C-Cover of the main housing portion 310. In various embodiments, the keyboard 330 may be mounted to the underside of the C-Cover of the main housing portion 310.

Lid housing portion 312 is rotationally coupled to main housing portion 310 via at least one hinge assembly 334. Lid housing portion 312 includes display 340 that visually presents information to the user as well as a bezel 342. Display 340 may be a touch panel with circuitry enabling touch functionality in conjunction with a display. In some embodiments, display 340 may be an "infinity edge" or "narrow bezel" display that approaches one or more the edges of lid housing portion 312 such that the bezel may be narrow in size (e.g., less than 10 millimeters) on the edges. For example, display 340 is an infinity display with narrow bezels on the top and sides of lid housing portion 312 in the embodiment shown in FIG. 3. In certain embodiments, the side bezel is less than 4 mm (+/−10%) and the top bezel is less than 6 mm (+/−10%).

Lid housing portion 312 may also include timing controller (TCON) 350. Hinge assembly 330 may include cable 352 for communicably coupling one or more components within main housing portion 310 to one or more components within lid housing portion 312. For example, cable 352 may provide communication of graphics information from an I/O subsystem to TCON 350 for generation of visual images for display on display 340. Although a single cable 352 is shown, portable information handling system 300 may include one or more additional cables 352 for communicating components disposed in main housing portion 310 and lid housing portion 312. Placement of cable 352 may be selected based on design considerations, materials or manufacturing cost, material reliability, antenna placement, as well as any other considerations.

Hinge assembly 334 allows main housing portion 310 and lid housing portion 312 to rotate between a plurality of positions. For example, when portable information handling system 300 is not in use, lid housing portion 312 may be closed over the top of main portion 310 such that display 340 and keyboard 330 are protected from unintended use or damage. Rotation of lid housing portion 312 by approximately 90 degrees from main housing portion 310 brings display 340 in a raised "clamshell" position relative to keyboard 330 so that an end user can make inputs to keyboard 330 or touch panel portion of display 340 while viewing display 340. In some embodiments, clamshell position may represent lid housing portion 312 open between approximately 1 and 180 degrees from main housing portion 310. Rotation of lid housing portion 312 between approximately 180 and 359 degrees from main housing portion 310 may place portable information handling system 300 in "tablet stand" and/or "tent" positions. In tablet stand and tent positions, the user may make inputs via touch panel portion of display 340 while viewing display 340. A full 360 degree rotation of main housing portion 310 relative to lid housing portion 312 provides a tablet configuration having display 340 exposed to accept touch inputs. In any position, user inputs may be communicated to an I/O subsystem or a processor of the portable information handling system 300 for processing, and then updated information may be communicated back via cable 352 to display 340 for displaying to the user. Hinge assembly 334 may be comprised of one or more discrete hinges or a unified assembly of hinges.

In certain embodiments, the rear display cover portion 316 defines a recess into which a camera system 344 may be mounted. In certain embodiments, the camera system 344 corresponds to camera system 150. In certain embodiments, the camera system 344 comprises a meta-optics camera system.

Figure 4:
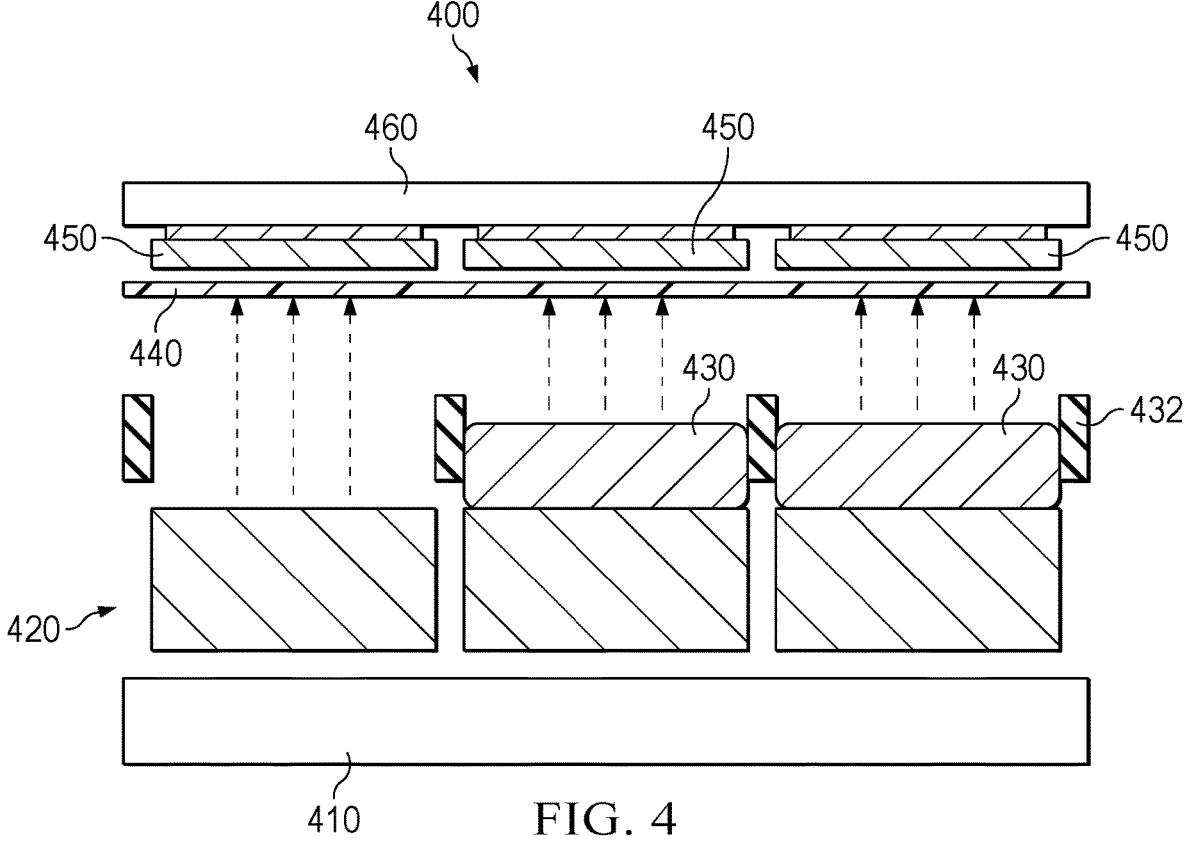
FIG. 4 shows a cross sectional view of a meta-optics component in accordance with the present disclosure.

FIG. 4 shows a cross sectional view of a meta-optics display component 400. In certain embodiments, the meta-optics display component 400 includes a micro-LED controller 410, a plurality of micro-LED pillars 420, a plurality of quantum dot (QD) color conversion elements 430, a divider mask 432, an optical film 440, a plurality of color filter (CF) elements 450 and a micro-optic lens 460. In certain embodiments, the plurality of micro-LED pillars 420 includes a plurality of blue micro-LED pillars. In certain embodiments, the plurality of QD color conversion elements 430 include a red QD color conversion element, a green QD color conversion element, or a combination thereof. In certain embodiments, the plurality of QD color conversion elements 430 are positioned over respective micro-LED pillars 420. In certain embodiments, the plurality of color filter elements 450 includes a blue color filter element, a red color filter element, a green color filter element, or a combination thereof. In certain embodiments, the plurality of color filter elements 430 are positioned over respective micro-LED pillars 420. In certain embodiments, the blue micro-LED pillar and the blue color filter element provide a blue transmission portion of the meta-optics display component 400. In certain embodiments, the blue micro-LED pillar, the red QD conversion element and the red color filter element provide a red transmission portion of the meta-optics display component 400. In certain embodiments, the blue micro-LED pillar, the green QD conversion element and the green color filter element provide a green transmission portion of the meta-optics display component 400.

In certain embodiments, the optical film 440 is positioned between one or both the micro-LED pillar 420 or the plurality of quantum dot color conversion elements 430 and the plurality of color filter elements 450. In certain embodiments, the optical film 440 is positioned between the blue micro-LED pillar 420 and the blue color filter element for the blue color transmission portion. In certain embodiments, the optical film 440 is positioned between and the red and green quantum dot color conversion elements 430 and red and green color filter elements for the red and green color transmission portions and the plurality of color filter elements 450.

In certain embodiments, the micro-LED controller 410 includes a pixel driver circuit. In certain embodiments, the micro-LED display controller 410 is contained within a semiconductor chip such as a complementary metal oxide semiconductor (CMOS) type semiconductor ship. In certain embodiments, the micro-LED display controller 410 provides a pixel driving function.

In certain embodiments, the meta-optic lens component 460 uses a nanoimprint technology to provide light management for some or all of the micro-LED pillars. As used herein, nanoimprint technology is broadly defined as a method for fabricating nanometer scale patterns onto the meta-optic lens. In certain embodiments, the nanoimprint technology comprises a nanolithography process which results in low cost, high throughput and high resolution imprinting of nanometer scale patterns onto the meta-optics lens. In certain embodiments the nanoimprint technology generates patterns by mechanical deformation of imprint resist and subsequent processes. The imprint resist is typically a monomer or polymer formulation that is cured by heat or UV light during the imprinting. Adhesion between the resist and the template is controlled to allow proper release. In certain embodiments, the nanoimprint technology is deposited onto a transparent substrate, such as glass, to provide a flat meta-optic lens. In certain embodiments, the nanoimprint features are designed to interact with light output of the pillars 420 to direct the light to a desirable pattern. In various embodiments, nanoimprint features are applied to both surfaces of the glass substrate of the lens component 460. In various embodiments, the lens component 460 can include multiple layers. In various embodiments, the nanoimprint features can be stacked in some or all of the multiple layers for complex light management.

In certain embodiments, a meta-optic lens rests on top of the mask structure 432 designed to create cavity walls to prevent light cross talk between pixels. In certain embodiments, the mask structure 432 includes a mask grid designed to create cavity walls to prevent light cross talk between the sub pixels generated by the pillars 420. In certain embodiments, the mask structure 432 assists with inkjet deposition of a quantum dot (QD) color conversion elements 430 or the color filter elements 450. Such a meta-optic display architecture greatly simplifies the display optical design, enhances light output due to a square form factor and simplifies display assembly. In certain embodiments, the meta-optic display architecture includes a micro-lens.

In certain embodiments, the micro-optic lens 460 is imprinted with pillar features designed to capture, mix and distribute monochrome light (R, G, or B) to a surface of the display. In certain embodiments, the monochrome light includes a red light portion, a green light portion, a blue light portion, or a combination thereof. In certain embodiments, the imprint features are imprinted to a single surface, to a pair of surfaces or to multiple surface layers.

In certain embodiments, the micro-optic lens 460 provides a bi-directional micro-lens function. In certain embodiments, the micro-lens rests on top of the mask structure 432 or the optical film 440. In certain embodiments, the micro-optic lens is locked in place to provide structural integrity to the display architecture. In certain embodiments, the micro-optic lens 460 is locked in place using UV or other processes. In certain embodiments, the micro-optic lens 460 provides a top layer passivation function. In certain embodiments, the micro-optic lens 460 is configured as a laminated film. In certain embodiments, the micro-optic lens 460 is configured as a laminated polarizer. In certain embodiments, the micro-lens provides protection from touch and light pen writing and optimizes front of screen (FOS) display performance.

In certain embodiments, the micro-LED display controller 410 provides time multiplexing pixel control. In certain embodiments, the time multiplexing pixel control provided by the micro-LED display controller 410 allows light trafficking in and out of respective pixels and/or adjacent pixels without light cross talk or color aberration.

In certain embodiments, the meta-optic display architecture comprises a micro-LED pixel array. In certain embodiments, the micro-LED pixel array includes a plurality of light emitting sub-pixels. In certain embodiments, the plurality of light emitting sub-pixels are distributed across the display surface in a repeating pattern. In certain embodiments, the repeating pattern includes a next to pattern (e.g., (R, G, B, Red camera sensor), (R, G, B, Green camera sensor), (R, G, B, Blue camera sensor), (R, G, B, R IR sensor)), etc. Such a meta-optic display architecture simplifies light management, eliminates bulky refractive micro lenses, and simplifies display assembly structure.

Figure 5:
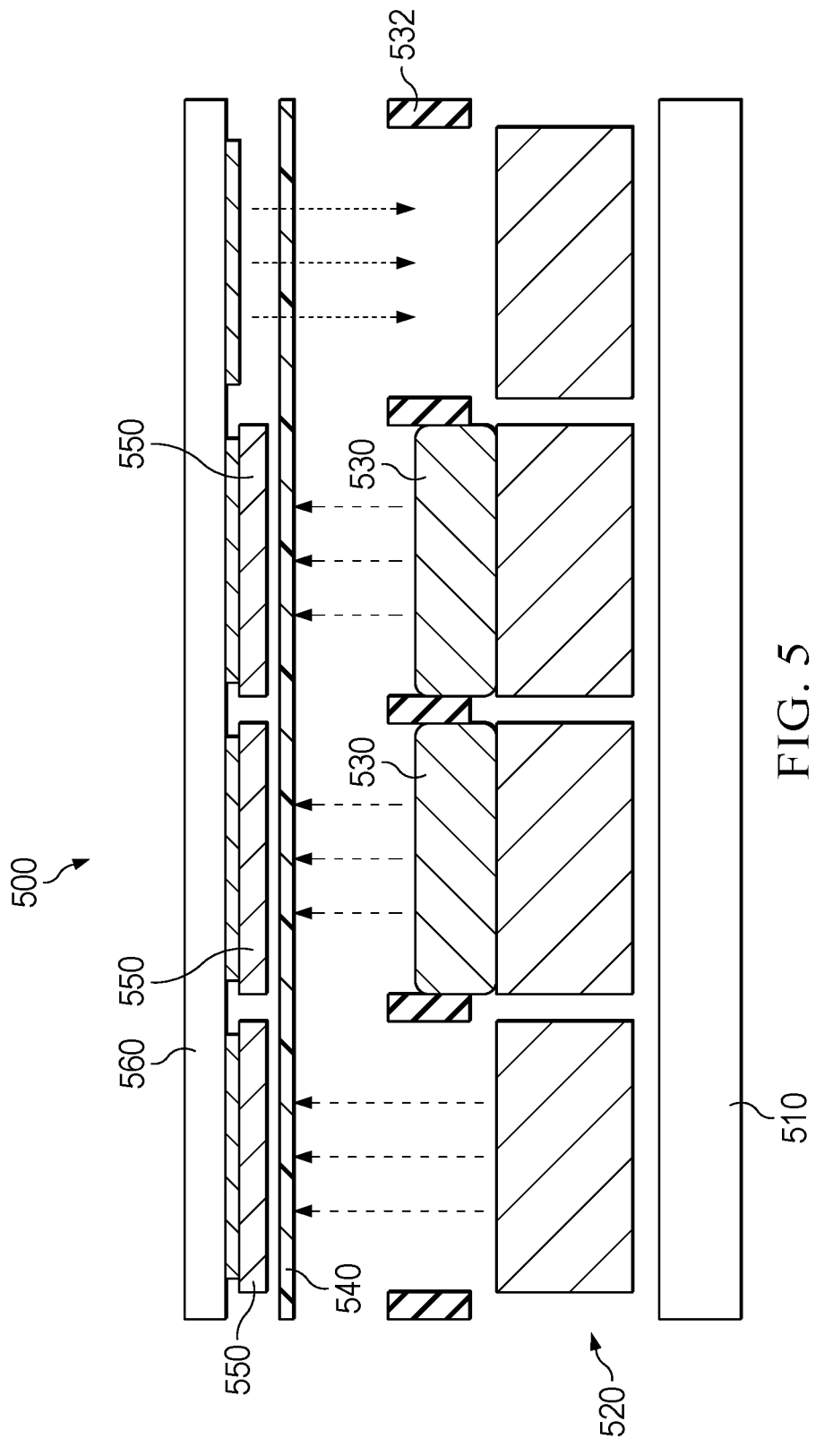
FIG. 5 shows a cross sectional view of an alternate meta-optics component in accordance with the present disclosure.

FIG. 5 shows a cross sectional view of a meta-optics component having a sensor function 500. In certain embodiments, the meta-optics display component 500 includes a micro-LED controller 510, a plurality of micro-LED pillars 520, a sensor pillar 522, a plurality of quantum dot (QD) color conversion elements 530, a divider mask 532, an optical film 540, a plurality of color filter (CF) elements 550 and a micro-optic lens 560. In certain embodiments, the plurality of micro-LED pillars 520 includes a plurality of blue micro-LED pillars. In certain embodiments, the sensor pillar 522 comprises a micro sensor. In certain embodiments, the micro-sensor is associated with the plurality of micro-LED pillars. In certain embodiments, the plurality of QD color conversion elements 530 includes a red QD color conversion element, a green QD color conversion element, or a combination thereof. In certain embodiments, the plurality of QD color conversion elements 530 are positioned over respective micro-LED pillars 520. In certain embodiments, the plurality of color filter elements 550 include a blue color filter element, a red color filter element, a green color filter element, or a combination thereof. In certain embodiments, the plurality of color filter elements 530 are positioned over respective micro-LED pillars 520. In certain embodiments, the blue micro-LED pillar and the blue color filter element provide a blue transmission portion of the meta-optics display component 500. In certain embodiments, the blue micro-LED pillar, the red QD conversion element and the red color filter element provide a red transmission portion of the meta-optics display component 500. In certain embodiments, the blue micro-LED pillar, the green QD conversion element and the green color filter element provide a green transmission portion of the meta-optics display component 500.

In certain embodiments, the optical film 540 is positioned between one or both the micro-LED pillar 520 or the plurality of quantum dot color conversion elements 530 and the plurality of color filter elements 550. In certain embodiments, the optical film 540 is positioned between the blue micro-LED pillar 520 and the blue color filter element for the blue color transmission portion. In certain embodiments, the optical film 540 is positioned between and the red and green quantum dot color conversion elements 530 and red and green color filter elements for the red and green color transmission portions and the plurality of color filter elements 550.

In certain embodiments, the micro-LED controller 510 includes a pixel driver circuit. In certain embodiments, the micro-LED display controller 510 is contained within a semiconductor chip such as a complementary metal oxide semiconductor (CMOS) type semiconductor ship. In certain embodiments, the micro-LED display controller 510 provides a pixel driving function and a sensor interpretation function.

In certain embodiments, the meta-optic lens component 560 uses a nanoimprint technology for light management. In certain embodiments, the nanoimprint technology may be used to manage surface light reflection of the meta-optic lens component. In certain embodiments, the nanoimprint technology is deposited onto a transparent substrate, such as glass, to provide a flat meta-optic lens. In certain embodiments, the nanoimprint features are designed to interact with light output of the pillars 520 to direct the light to a desirable pattern. In various embodiments, nanoimprint features are applied to both surfaces of the glass substrate of the lens component 560. In various embodiments, the lens component 560 can include multiple layers. In various embodiments, the nanoimprint features can be stacked in some or all of the multiple layers for complex light management.

In certain embodiments, a meta-optic lens rests on top of the mask structure 532 designed to create cavity walls to prevent light cross talk between pixels. In certain embodiments, the mask structure 532 includes a mask grid designed to create cavity walls to prevent light cross talk between the sub pixels generated by the pillars 520. In certain embodiments, the mask structure 532 assists with inkjet deposition of a quantum dot (QD) color conversion elements 530 or the color filter elements 550. Such a meta-optic display architecture greatly simplifies the display optical design, enhances light output due to a square form factor and simplifies display assembly. In certain embodiments, the meta optic display architecture includes a micro-lens.

In certain embodiments, the micro-optic lens 560 is imprinted with pillar features designed to capture, mix and distribute monochrome light (R, G, or B) to a surface of the display. In certain embodiments, the monochrome light includes a red light portion, a green light portion, a blue light portion, or a combination thereof. In certain embodiments, the imprint features are imprinted to a single surface, to a pair of surfaces or to multiple surface layers.

In certain embodiments, the micro-optic lens 560 provides a bi-directional micro-lens function. In certain embodiments, the micro-lens rests on top of the mask structure 532 or the optical film 540. In certain embodiments, the micro-optic lens is locked in place to provide structural integrity to the display architecture. In certain embodiments, the micro-optic lens 560 is locked in place using UV or other processes. In certain embodiments, the micro-optic lens 560 provides a top layer passivation function. In certain embodiments, the micro-optic lens 560 is configured as a laminated film. In certain embodiments, the micro-optic lens 560 is configured as a laminated polarizer. In certain embodiments, the micro-lens provides protection from touch and light pen writing and optimizes front of screen (FOS) display performance.

In certain embodiments, the micro-LED display controller 510 provides time multiplexing pixel control. In certain embodiments, the time multiplexing pixel control provided by the micro-LED display controller 510 allows light trafficking in and out of respective pixels and/or adjacent pixels without light cross talk or color aberration.

In certain embodiments, the meta-optic display architecture comprises a micro-LED pixel array. In certain embodiments, the micro-LED pixel array includes a plurality of light emitting sub-pixels. In certain embodiments, certain sub-pixels include additional functionality. In certain embodiments, the additional functionality is provided by the sensor pillar 522. In certain embodiments, the additional functionality includes one or more of a camera sensor function, a light senor function, an IR sensor function, etc. In certain embodiments, the additional functionality is distributed across the display surface in a repeating pattern. In certain embodiments, the repeating pattern includes a light sensor pattern (e.g. R, G, B, light sensor), a next to pattern (e.g., (R, G, B, Red camera sensor), (R, G, B, Green camera sensor), (R, G, B, Blue camera sensor), (R, G, B, R IR sensor)), etc. Such a meta-optic display architecture simplifies light management, eliminates bulky refractive micro lenses, and simplifies display assembly structure.

In certain embodiments, the meta-optics display architecture can be configured with additional functionality such as camera function performed by the display or light sensors within the display receive light input along a side of a pixel that already has upward light output.

In certain embodiments, the micro-optic lens 560 is imprinted with pillar features designed to capture, mix and distribute monochrome light (R, G, or B) to a surface of the display. In certain embodiments, the monochrome light includes a red light portion, a green light portion, a blue light portion, a clear sensor portion or a combination thereof. In certain embodiments, the imprint features are imprinted to a single surface, to a pair of surfaces or to multiple surface layers. In certain embodiments, the micro-optic lens 560 with imprinted features allows outside light, visible or IR, specific visible or non-visible optical communication wavelength light, to pass through the glass and through the internal imprinted pillars layer to spread light across the sensor (e.g., a camera sensor, a light sensor, an IR sensor, etc.).

Figure 6:
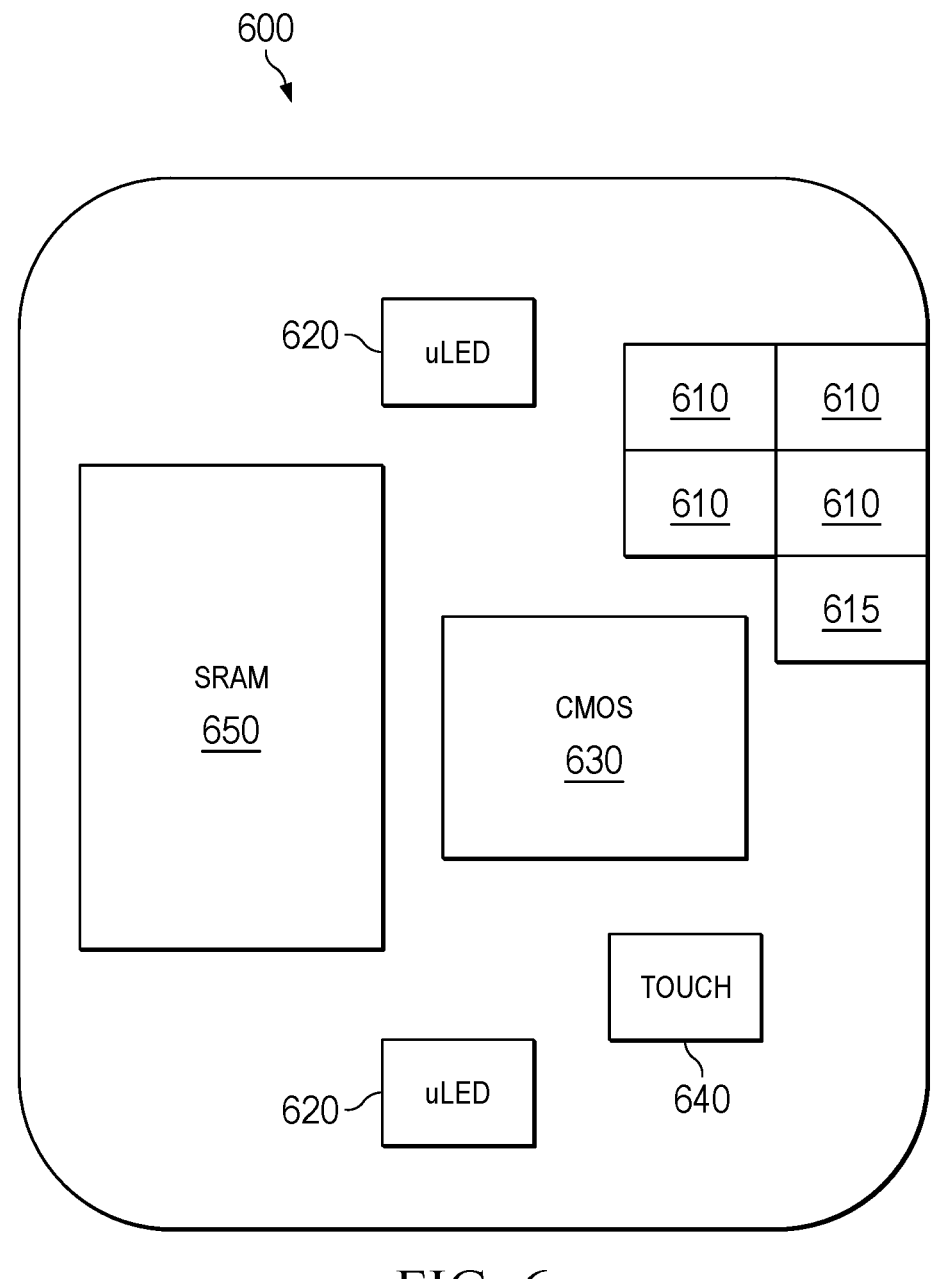
FIG. 6 shows a block diagram of a pixel of a meta-optics component in accordance with the present disclosure.

FIG. 6 shows a block diagram of a pixel 600 of a meta-optics component. More specifically, some of all of the pixels 600 of the display architecture include a plurality of image pixels 610, a sensor pixel 615, a plurality of micro-LED pixel components 620, a controller portion 630, a touch portion 640 and a memory portion 650. In certain embodiments, the image pixels 610 include a red image pixel, a green image pixel, a blue image pixel, or a combination thereof. In certain embodiments, certain pixels of the display architecture include two green image pixels for each read and blue image pixels. In certain embodiments, the controller portion 630 is contained within a semiconductor chip such as a complementary metal oxide semiconductor (CMOS) type semiconductor chip. In certain embodiments, the controller portion 630 provides a pixel driving function. In certain embodiments, the memory portion 630 is contained within a semiconductor chip such as a static random access memory (SRAM) type semiconductor chip. In certain embodiments, the memory portion 650 stores instructions to be used by the controller portion 630 when performing the pixel driving function. In certain embodiments, the memory portion 650 stores pixel content to be presented by the pixel of the display architecture. In certain embodiments, the touch portion 640 provides the pixel 600 with touch sensitive functionality.

Figure 7:
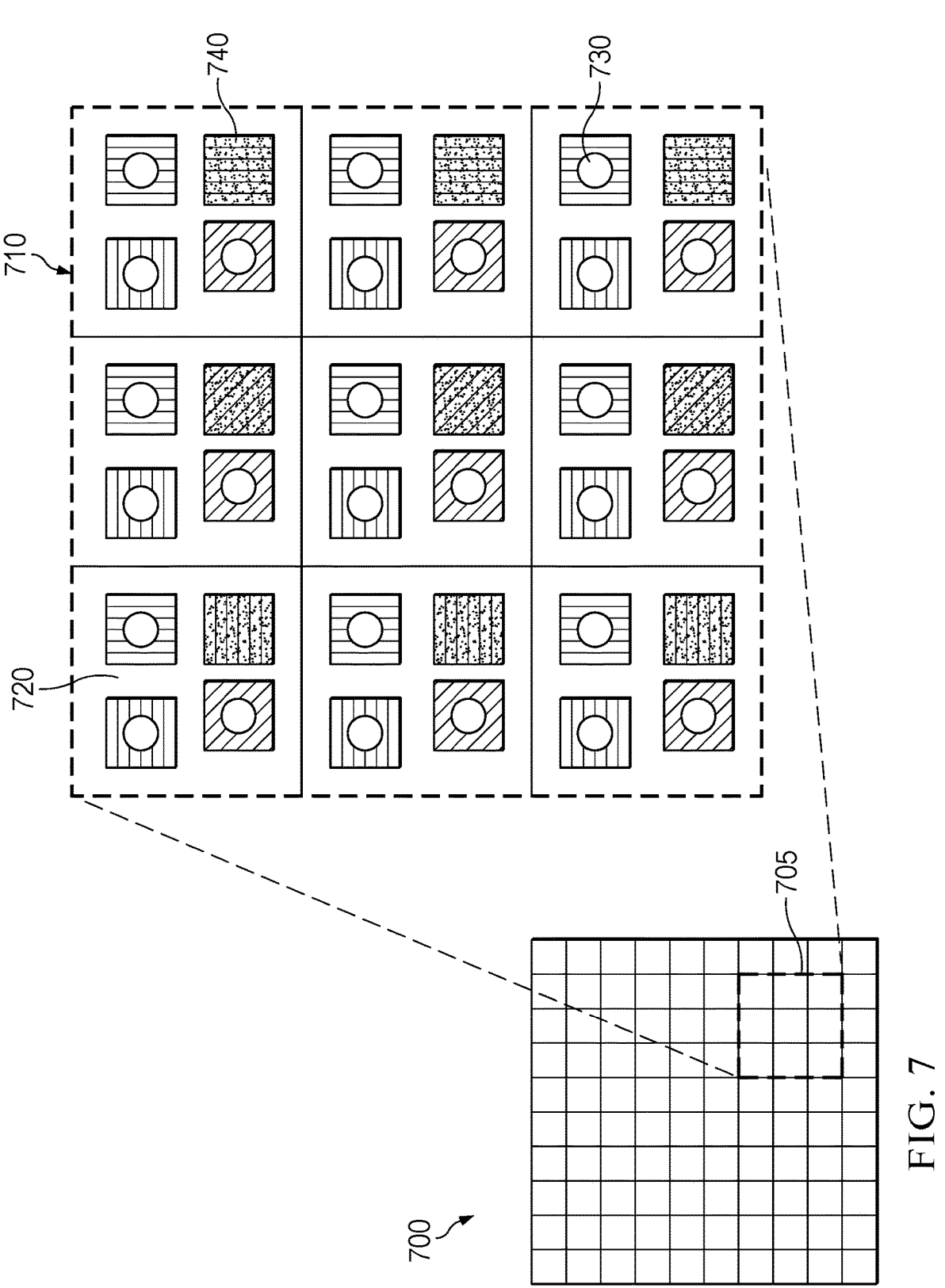
FIG. 7 shows a block diagram of a micro-optics pixel layout in accordance with the present disclosure.

FIG. 7 shows a block diagram of a micro-optics pixel layout 700. In certain embodiments, the micro-optics pixel layout 700 is divided into pixel array sets 705. In certain embodiments, each pixel array set 705 includes a 3×3 pixel arrangement 710. In certain embodiments the 3×3 pixel arrangement 710 includes 9 pixels 720. In certain embodiments, each pixel 720 includes a plurality of pillars 730. In certain embodiments, certain pixels also include a sensor pillar 740. In certain embodiments, various pixels 720 can include different types of sensors. In certain embodiments, the sensor pillar 740 corresponds to a camera sensor. In certain embodiments, the different types of sensors can include a monochrome camera sensor with a blue color filter overlay. In certain embodiments, the different types of sensors can include a monochrome camera sensor with a red color filter overlay. In certain embodiments, the different types of sensors can include a monochrome camera sensor with a green color filter overlay. In certain embodiments, each monochrome camera sensor is designed to function as a different focal length (F1, F2, F3). It will be appreciated that other pixel array sets are contemplated. For example, in certain embodiments, each pixel array set can include a 4×4 pixel arrangement or a 5×5 pixel arrangement. In certain embodiments, the 4×4 pixel arrangement can include sets of red, green, blue, yellow (RGBY) type pixels or red, green, blue, white (RGBW) pixels and the 5×5 pixel arrangement can include red, green, blue, white, yellow (RGBWY) pixels.

In certain embodiments, the micro-LED pixel array includes a plurality of light emitting sub-pixels. In certain embodiments, each light emitting sub-pixel includes a sub-Pixel micro-LED light emission opening 750. In certain embodiments, certain sub-pixels include additional functionality. In certain embodiments, the additional functionality includes one or more of a camera sensor function, a light senor function, an IR sensor function, etc. In certain embodiments, the additional functionality is distributed across the display surface in a repeating pattern. In certain embodiments, the repeating pattern includes a light sensor pattern (e.g. R, G, B, light sensor), a next to pattern (e.g., (R, G, B, Red camera sensor), (R, G, B, Green camera sensor), (R, G, B, Blue camera sensor), (R, G, B, R IR sensor)), etc. Such a meta-optic display architecture simplifies light management, eliminates bulky refractive micro lenses, and simplifies display assembly structure.

Figure 8:
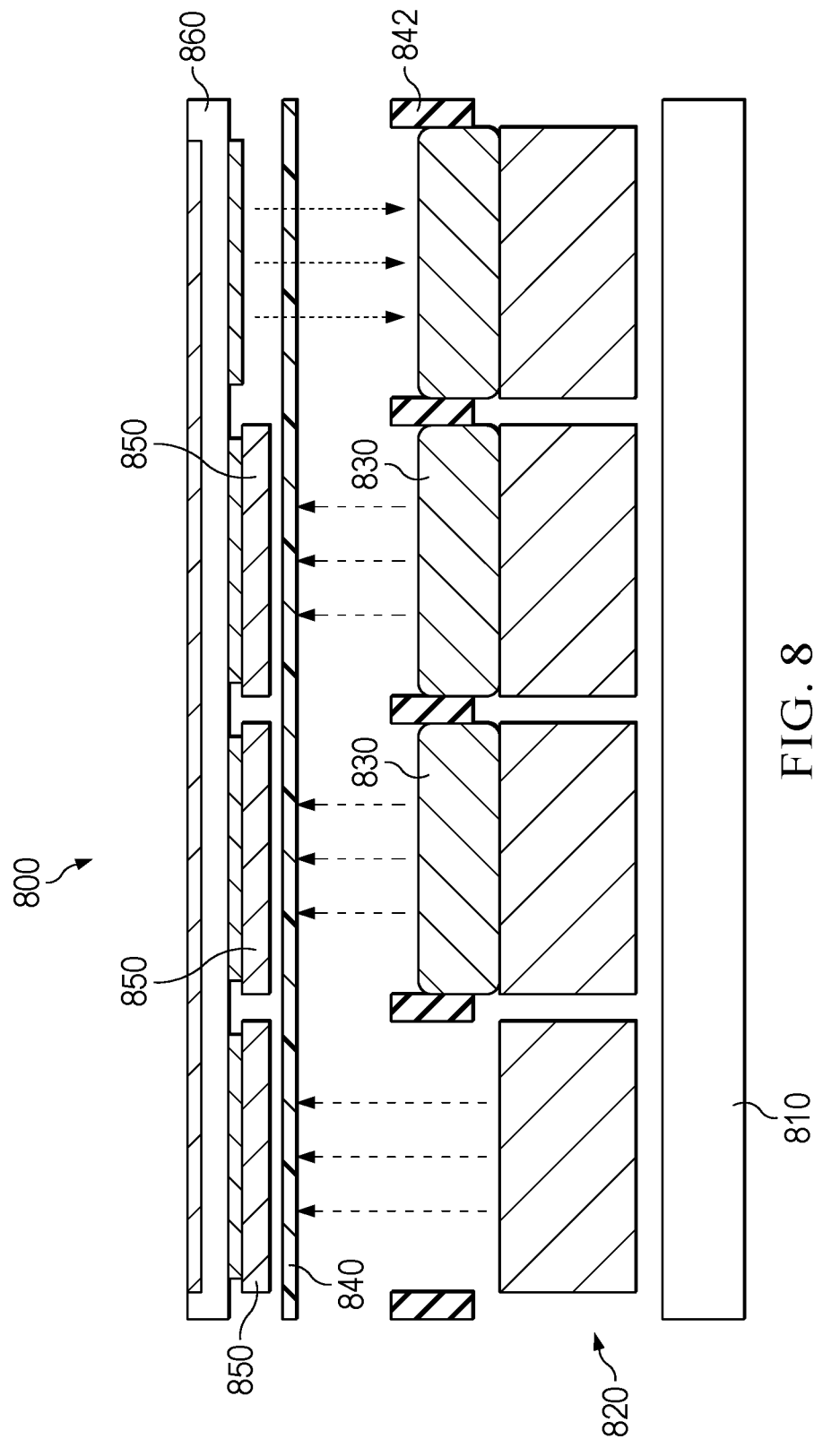
FIG. 8 shows an example of a nano-pillars pattern used to manage a sub-pixel or camera sensor in accordance with the present disclosure.

FIG. 8 shows an example of a nano-pillars pattern used to manage a sub-pixel or camera sensor. In certain embodiments, a color filter, such as a blue color filter, may be positioned over the sensor. In certain embodiments, nano-feature pillars of a micro-optic lens are optically optimized for a monochrome light (e.g., a blue light). In certain embodiments, nano-feature pillars of a micro-optic lens are optically optimized for a particular focal length (F). In certain embodiments, a mask is included within the display to prevent light cross talk and to facilitate optical lens assembly.

Figure 9:
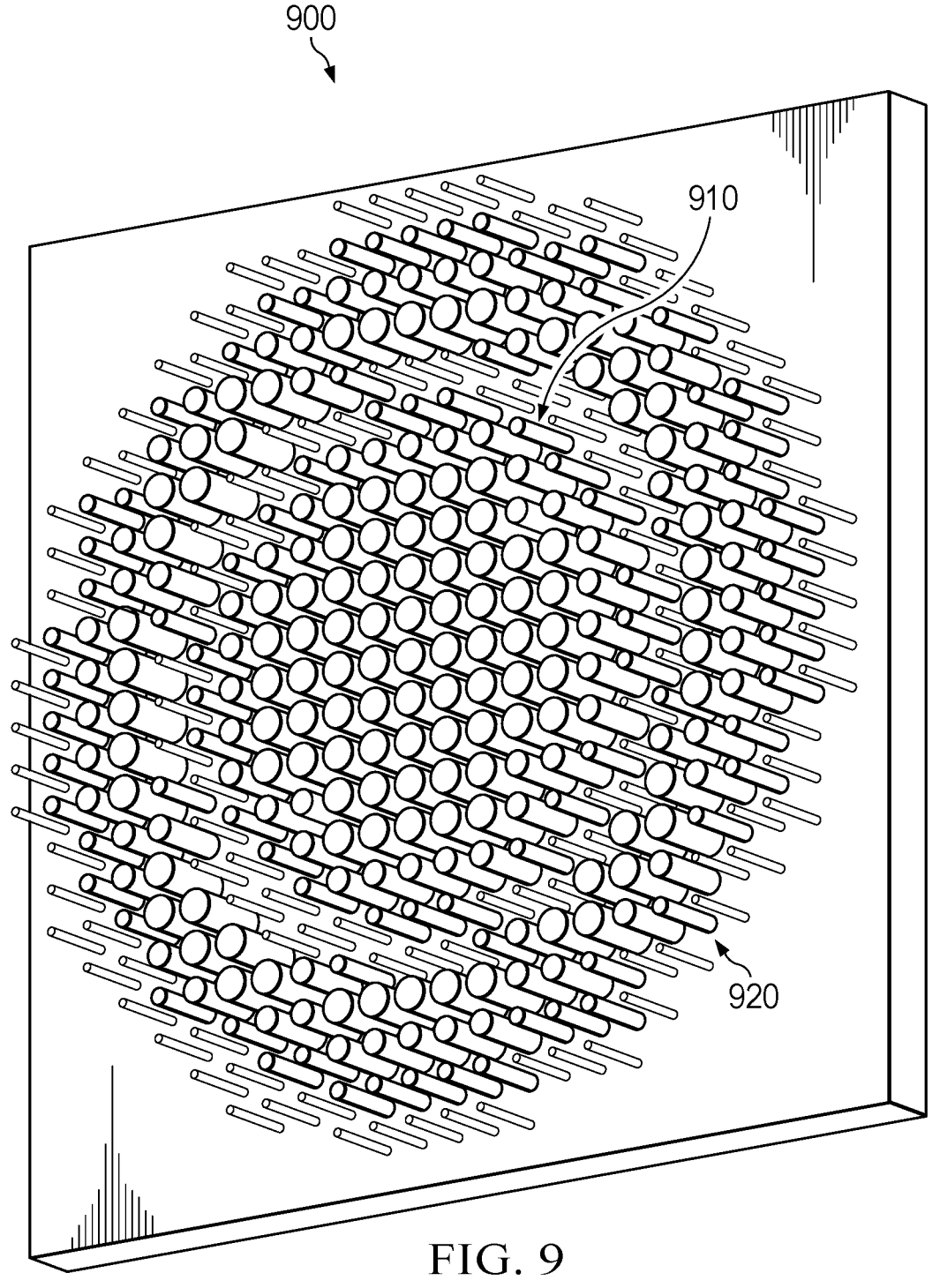
FIG. 9 shows a cross sectional view of a meta-optics display and sensor component in accordance with the present disclosure.
Figure 10:
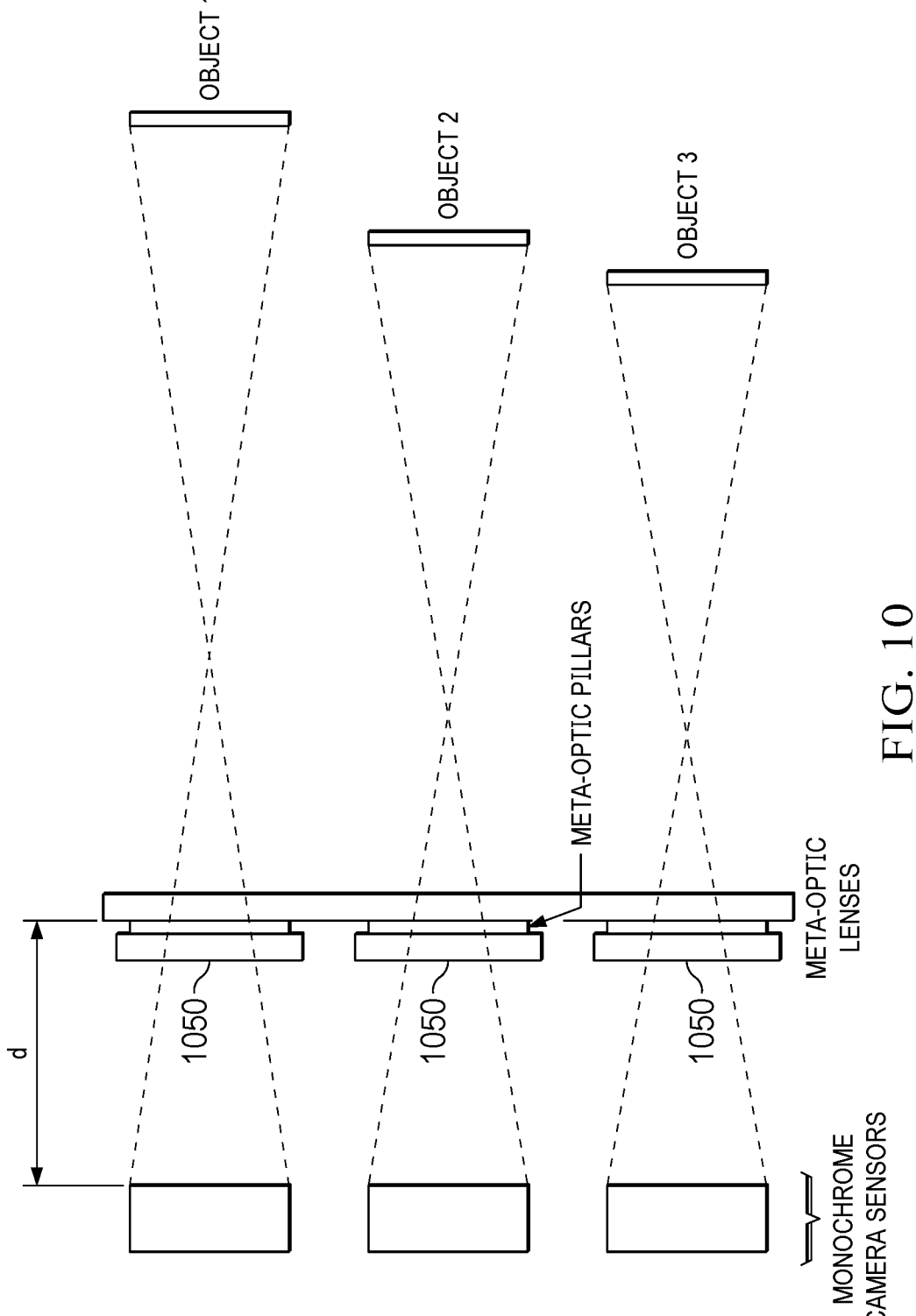
FIG. 10 shows a side view of a micro-optics sensor arrangement in accordance with the present disclosure.

FIG. 9 shows a cross sectional view of a meta-optics display and sensor component. More specifically, a meta-optics lens is nanoimprinted with a plurality of nano-pillars 900. In certain embodiments, each of the plurality of nano-pillars 900 are positioned over respective sub pixels of the display architecture. In certain embodiments, a shape of each pillar feature of the micro-optics lens corresponds to a shape of a corresponding micro-LED pillar. In certain embodiments, each of the plurality of nano-pillars include a respective interior round portion 910 and circular portion 920 surrounding the interior round portion 910. In certain embodiments, the plurality of nano-pillars manages light transmission from a respective LED sub-pixel or to a respective sensor pixel. In certain embodiments, the interior round portion 910, the circular portion 920, or a combination thereof provide pillar features designed to capture, mix and distribute monochrome light to a surface of the meta-optics display device.

FIG. 7 shows a block diagram of a micro-optics pixel layout 700. In certain embodiments, each pixel includes an associated color filter 1050. In certain embodiments, the micro-optics pixel layout 700 is divided into pixel array sets 705. In certain embodiments, each pixel array set 705 includes a 3×3 pixel arrangement 710. In certain embodiments the 3×3 pixel arrangement 710 includes 9 pixels 720. In certain embodiments, each pixel 720 includes a plurality of pillars 730. In certain embodiments, certain pixels also include a sensor pillar 740. In certain embodiments, various pixels 720 can include different types of sensors. In certain embodiments, the sensor pillar 740 corresponds to a camera sensor. In certain embodiments, the different types of sensors can include a monochrome camera sensor with a blue color filter overlay. In certain embodiments, the different types of sensors can include a monochrome camera sensor with a red color filter overlay. In certain embodiments, the different types of sensors can include a monochrome camera sensor with a green color filter overlay. In certain embodiments, each monochrome camera sensor is designed to function as a different focal length (F1, F2, F3).

It will be appreciated that other pixel array sets are contemplated. For example, in certain embodiments, each pixel array set can include a 4×4 pixel arrangement or a 5×5 pixel arrangement. In certain embodiments, the 4×4 pixel arrangement can include sets of red, green, blue, yellow (RGBY) type pixels or red, green, blue, white (RGBW) pixels and the 5×5 pixel arrangement can include red, green, blue, white, yellow (RGBWY) pixels.

Figure 11:
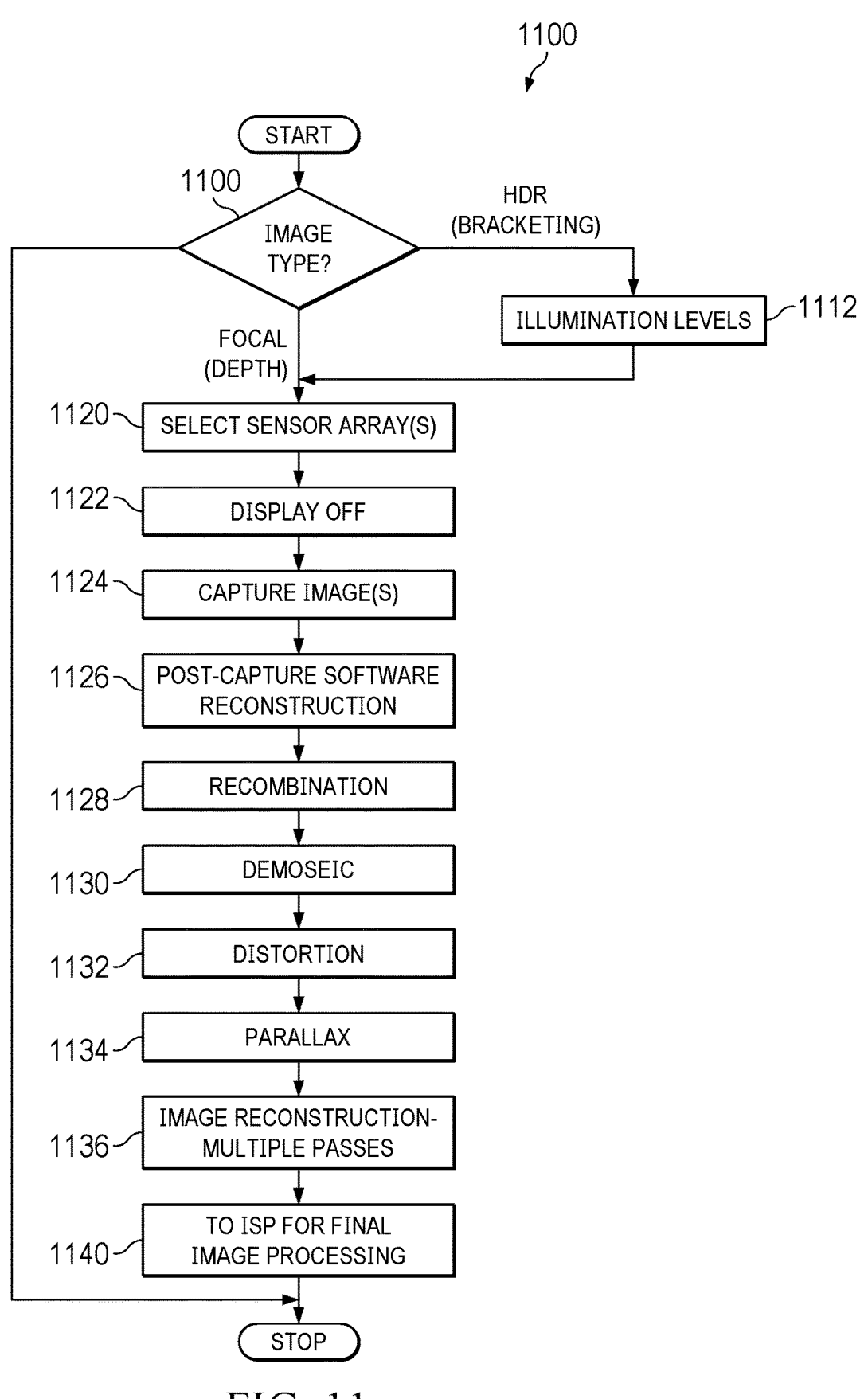
FIG. 11 shows a flowchart of the operation of a micro-optics image capture and post processing operation in accordance with the present disclosure.

FIG. 11 shows a flow chart of the operation of a micro-optics image capture and post processing operation 1100. In various embodiments, the micro-optics image capture and post processing operation 1100 is performed by a display controller, a camera controller, a camera sensor, or a combination thereof. More specifically, the micro-optics image capture and post processing operation 1100 starts operation by determining an image type at determination step 1110. More specifically, in certain embodiments, the determination step 1110 determines whether the image type is a focal image type or a high dynamic range (HDR) image time. In certain embodiments, the determination step 1110 uses a depth value when determining that the image type is a focal image type. In certain embodiments, the determination step uses a bracketing value when determining the image type is an HDR image type. When the image type is an HDR image type, the micro-optics image capture and post processing operation 1100 identifies illumination levels associated with the HDR image at step 1112.

Next, the micro-optics image capture and post processing operation 1100 selects sensor arrays to be used when capturing the image at step 1120. In certain embodiments, the micro-optics image capture and post processing operation 1100 momentarily turns the display off at step 1122 when capturing the image. Next, the micro-optics image capture and post processing operation 1100 captures the image using the selected sensor arrays at step 1124.

Next, the micro-optics image capture and post processing operation 1100 performs a post capture software reconstruction operation at step 1126. As used herein, a post capture software reconstruction operation broadly refers to any task, function, procedure, or process performed, directly or indirectly for reconstructing an image from portions of the image sensed by each of a plurality of micro-optics sensors. Next at step 1128, the micro-optics image capture and post processing operation 1100 performs a post capture image recombination operation. As used herein, a post capture image reconstruction operation broadly refers to any task, function, procedure, or process performed, directly or indirectly for recombining pixels of an image obtained from portions by each of a plurality of micro-optics sensors. Next at step 1130, the micro-optics image capture and post processing operation 1100 performs an image demosaic operation. As used herein, image demosaic operation broadly refers to any task, function, procedure, or process performed, directly or indirectly for reconstructing a full color image from the possibly incomplete color samples provided by the plurality of micro-optics sensors. In certain embodiments, the image demosaic operation takes into account whether an image sensor is overlaid with a color filter array (CFA).

Next at step 1132, the micro-optics image capture and post processing operation 1100 performs a distortion compensation operation. As used herein, a distortion compensation operation broadly refers to any task, function, procedure, or process performed, directly or indirectly for compensating for distortion of pixels of an image obtained from each of a plurality of micro-optics sensors such as distortions due to the positioning of the images sensors within a display matrix. Next at step 1134, the micro-optics image capture and post processing operation 1100 performs a parallax compensation operation. As used herein, a parallax compensation operation broadly refers to any task, function, procedure, or process performed, directly or indirectly for compensating for parallax of pixels of an image obtained from each of a plurality of micro-optics sensors such as parallax due to the relative positioning of the image sensors within a display matrix.

Next at step 1136, the micro-optics image capture and post processing operation 1100 performs an image reconstruction operation, possibly using multiple passes of the reconstruction operation. As used herein, an image reconstruction operation broadly refers to any task, function, procedure, or process performed, directly or indirectly for recombining pixels of an image obtained from portions by each of a plurality of micro-optics sensors to provide a reconstructed image. Next, at step 1140, the reconstructed image is provided to an image signal processor (ISP) for final image processing. In certain embodiments, the image signal processor is included within a display controller, a camera controller, a camera sensor, or a combination thereof.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. A meta-optics display device, comprising:

a plurality of micro-light-emitting diode (LED) pillars, and, a plurality of micro-sensors, at least some of the plurality of micro-sensors being associated with respective micro-LED pillars of the plurality of micro-LED pillars, the plurality of micro-sensors comprising a first set of micro-sensors and a second set of micro-sensors, the first set of micro-sensors being tuned for a first focal distance, the second set of micro-sensors being tuned for a second focal distance; and wherein the first set of micro-sensors capture a first image with a first field of view; and the second set of micro-sensors capture a second image with a second field of view.

2. The meta-optics display device of claim 1, wherein:

the first image and the second image are processed to improve image quality, to provide image depth, to extract image depth information, or a combination thereof.

3. The meta-optics display device of claim 1, wherein:

the plurality of micro-LED pillars and the plurality of micro-sensors are arranged in a micro-optics pixel layout divided into pixel array sets;

each pixel of a pixel array set includes a plurality of pillars; and, certain pixels of the pixel array set include a respective micro-sensor.

4. The meta-optics display device of claim 3, wherein:

various pixels of the pixel array set include different types of micro-sensors.

5. The meta-optics display device of claim 1, further comprising:

a micro-optics lens positioned above the plurality of micro-LED pillars and the plurality of micro-sensors, the micro-optics lens comprising nanoimprint technology deposited onto a transparent substrate to correspond to at least some of the plurality of micro-LED pillars and at least some of the plurality of micro-sensors, a first portion of the micro-optics lens being optimized for the first focal length, a second portion of the micro-optics lens being optimized for the second focal length.

6. A lid housing portion of an information handling system, comprising:

a display cover portion;

a rear display cover portion coupled to the display cover portion; and, a meta-optics display device mounted to the display cover portion, the meta-optics display device comprising a plurality of micro-light-emitting diode (LED) pillars, and, a plurality of micro-sensors, at least some of the plurality of micro-sensors being associated with respective micro-LED pillars of the plurality of micro-LED pillars, the plurality of micro-sensors comprising a first set of micro-sensors and a second set of micro-sensors, the first set of micro-sensors being tuned for a first focal distance, the second set of micro-sensors being tuned for a second focal distance; and wherein the first set of micro-sensors capture a first image with a first field of view; and the second set of micro-sensors capture a second image with a second field of view.

7. The lid housing portion of claim 6, wherein:

the first image and the second image are processed to improve image quality, to provide image depth, to extract image depth information, or a combination thereof.

8. The lid housing portion of claim 6, wherein:

the plurality of micro-LED pillars and the plurality of micro-sensors are arranged in a micro-optics pixel layout divided into pixel array sets;

each pixel of a pixel array set includes a plurality of pillars; and, certain pixels of the pixel array set include a respective micro-sensor.

9. The lid housing portion of claim 8, wherein:

various pixels of the pixel array set include different types of micro-sensors.

10. The lid housing portion of claim 6, wherein the meta-optics display device further comprises:

a micro-optics lens positioned above the plurality of micro-LED pillars and the plurality of micro-sensors, the micro-optics lens comprising nanoimprint technology deposited onto a transparent substrate to correspond to at least some of the plurality of micro-LED pillars and at least some of the plurality of micro-sensors, a first portion of the micro-optics lens being optimized for the first focal length, a second portion of the micro-optics lens being optimized for the second focal length.

11. An information handling system comprising:

a processor;

a data bus coupled to the processor;

an information handling system chassis housing, the housing comprising a base chassis, the base chassis housing the processor; and, an information handling system display chassis, the information handing system display chassis comprising a meta-optics display device, the meta-optics display device comprising a plurality of micro-light-emitting diode (LED) pillars, and, a plurality of micro-sensors, at least some of the plurality of micro-sensors being associated with respective micro-LED pillars of the plurality of micro-LED pillars, the plurality of micro-sensors comprising a first set of micro-sensors and a second set of micro-sensors, the first set of micro-sensors being tuned for a first focal distance, the second set of micro-sensors being tuned for a second focal distance; and wherein the first set of micro-sensors capture a first image with a first field of view; and the second set of micro-sensors capture a second image with a second field of view.

12. The information handling system of claim 11, wherein:

the first image and the second image are processed to improve image quality, to provide image depth, to extract image depth information, or a combination thereof.

13. The information handling system of claim 11, wherein:

the plurality of micro-LED pillars and the plurality of micro-sensors are arranged in a micro-optics pixel layout divided into pixel array sets;

each pixel of a pixel array set includes a plurality of pillars; and, certain pixels of the pixel array set include a respective micro-sensor.

14. The information handling system of claim 13, wherein:

various pixels of the pixel array set include different types of micro-sensors.

15. The information handling system of claim 11, wherein the meta-optics display device further comprises:

a micro-optics lens positioned above the plurality of micro-LED pillars and the plurality of micro-sensors, the micro-optics lens comprising nanoimprint technology deposited onto a transparent substrate to correspond to at least some of the plurality of micro-LED pillars and at least some of the plurality of micro-sensors, a first portion of the micro-optics lens being optimized for the first focal length, a second portion of the micro-optics lens being optimized for the second focal length.

\*    \*    \*    \*    \*